United States Patent
Kataoka et al.

(10) Patent No.: US 10,768,241 B2
(45) Date of Patent: Sep. 8, 2020

(54) POWER SUPPLY CIRCUIT AND SOUND EQUIPMENT

(71) Applicant: YAMAHA CORPORATION, Hamamatsu-shi (JP)

(72) Inventors: Takuya Kataoka, Hamamatsu (JP); Hitoshi Shima, Hamamatsu (JP)

(73) Assignee: YAMAHA CORPORATION, Hamamatsu-Shi (JP)

( * ) Notice: Subject to any disclaimer, the term of this patent is extended or adjusted under 35 U.S.C. 154(b) by 29 days.

(21) Appl. No.: 16/123,342

(22) Filed: Sep. 6, 2018

(65) Prior Publication Data
US 2019/0094312 A1 Mar. 28, 2019

(30) Foreign Application Priority Data
Sep. 27, 2017 (JP) ................. 2017-185602

(51) Int. Cl.
| | | |
|---|---|---|
| G01R 31/40 | (2020.01) | |
| G01R 31/30 | (2006.01) | |
| G01R 19/165 | (2006.01) | |
| H03F 3/217 | (2006.01) | |
| H02J 9/06 | (2006.01) | |

(Continued)

(52) U.S. Cl.
CPC ....... *G01R 31/40* (2013.01); *G01R 19/16547* (2013.01); *G01R 31/3004* (2013.01); *G01R 31/3278* (2013.01); *H02H 1/06* (2013.01); *H02H 3/20* (2013.01); *H02H 3/247* (2013.01); *H02H 9/02* (2013.01); *H02J 9/06* (2013.01); *H02M 7/06* (2013.01); *H03F 1/0211* (2013.01); *H03F 1/52* (2013.01); *H03F 3/187* (2013.01);
(Continued)

(58) Field of Classification Search
CPC ................ G01R 31/40; G01R 31/3004; G01R 31/3278; H02H 3/20; H02H 3/247; H02H 9/001; H02H 9/02; H02H 9/06; H02M 7/04; H02M 7/06; H02M 7/20
See application file for complete search history.

(56) References Cited

U.S. PATENT DOCUMENTS 5,847,610 A * 12/1998 Fujita ........................ H03F 1/52
                                                    330/298
5,917,716 A * 6/1999 Cho ...................... H02H 7/1227
                                                    363/21.14
9,520,839 B2 * 12/2016 Takahama ........ G01R 19/16509

FOREIGN PATENT DOCUMENTS

| CN | 202633687 U | 12/2012 |
| JP | H10271668 A | 10/1998 |

(Continued)

OTHER PUBLICATIONS

Translation of JP 2006-345624.*

(Continued)

*Primary Examiner* — Minh N Tang
(74) *Attorney, Agent, or Firm* — Rossi, Kimms & McDowell LLP

(57) ABSTRACT

A power supply circuit includes an internal power source that receives power supply from an external power source, an abnormality detection circuit that receives power supply from the internal power source to detect abnormalities of the external power source, a protection target circuit that receives the power supply from the external power source, and a protection function unit that restricts electric power supplied to the protection target circuit to a predetermined range, when the abnormality detection circuit detects the abnormalities.

8 Claims, 15 Drawing Sheets

(51) Int. Cl.
| | |
|---|---|
| *G01R 31/327* | (2006.01) |
| *H02H 9/02* | (2006.01) |
| *H02H 3/247* | (2006.01) |
| *H02M 7/06* | (2006.01) |
| *H03F 1/52* | (2006.01) |
| *H02H 3/20* | (2006.01) |
| *H02H 1/06* | (2006.01) |
| *H03F 3/187* | (2006.01) |
| *H03F 1/02* | (2006.01) |
| *H03G 3/34* | (2006.01) |
| *H02H 9/00* | (2006.01) |

(52) U.S. Cl.
CPC ............ *H03F 3/217* (2013.01); *H02H 9/001* (2013.01); *H03F 2200/03* (2013.01); *H03G 3/348* (2013.01)

(56) References Cited

FOREIGN PATENT DOCUMENTS

| JP | 2006345624 A | * 12/2006 |
|---|---|---|
| JP | 2009284561 A | * 12/2009 |

OTHER PUBLICATIONS

Translation of JP 2009-284561.*
Office Action issued in Chinese Appln. No. 201811130533.6 dated Oct. 14, 2019. English translation provided.
Office Action issued in Chinese Appln. No. 201811130533.6 dated Jun. 23, 2020. English translation provided.

* cited by examiner

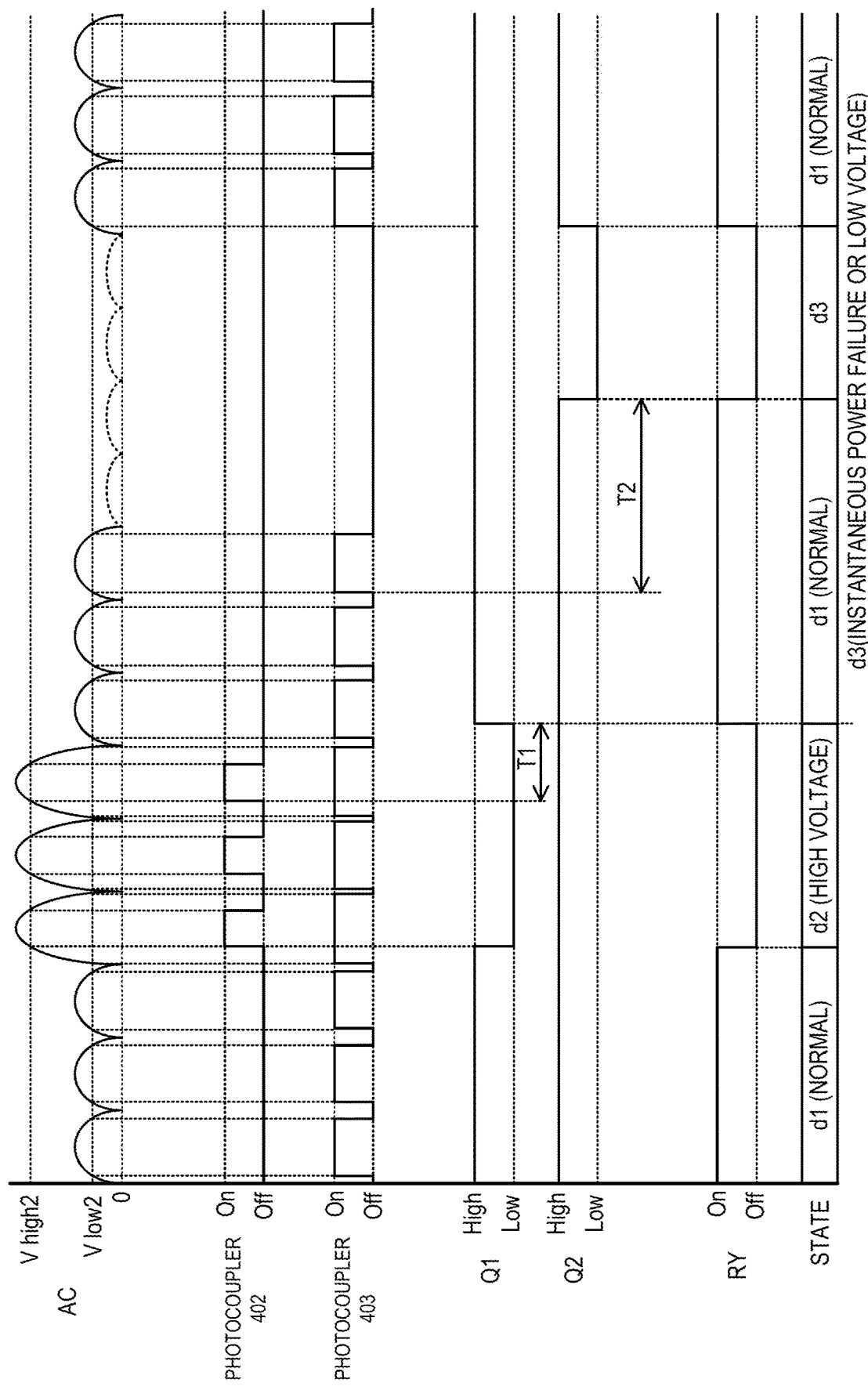

| STATE | Vcc | Q1 | Q2 | RY | |
|---|---|---|---|---|---|
| d1 | On | High | High | On | NORMAL OPERATION |
| d2 | On | Low | High | Off | POWER SOURCE IS INTERCEPTED ACCORDING TO DETECTION OF HIGH VOLTAGE (VOLTAGE MORE THAN Vhigh2) |
| d3 | On | High | Low | Off | POWER SOURCE IS INTERCEPTED ACCORDING TO DETECTION OF INSTANTANEOUS POWER FAILURE OR LOW VOLTAGE (VOLTAGE LESS THAN Vlow2 CONTINUES FOR PREDETERMINED TIME) |

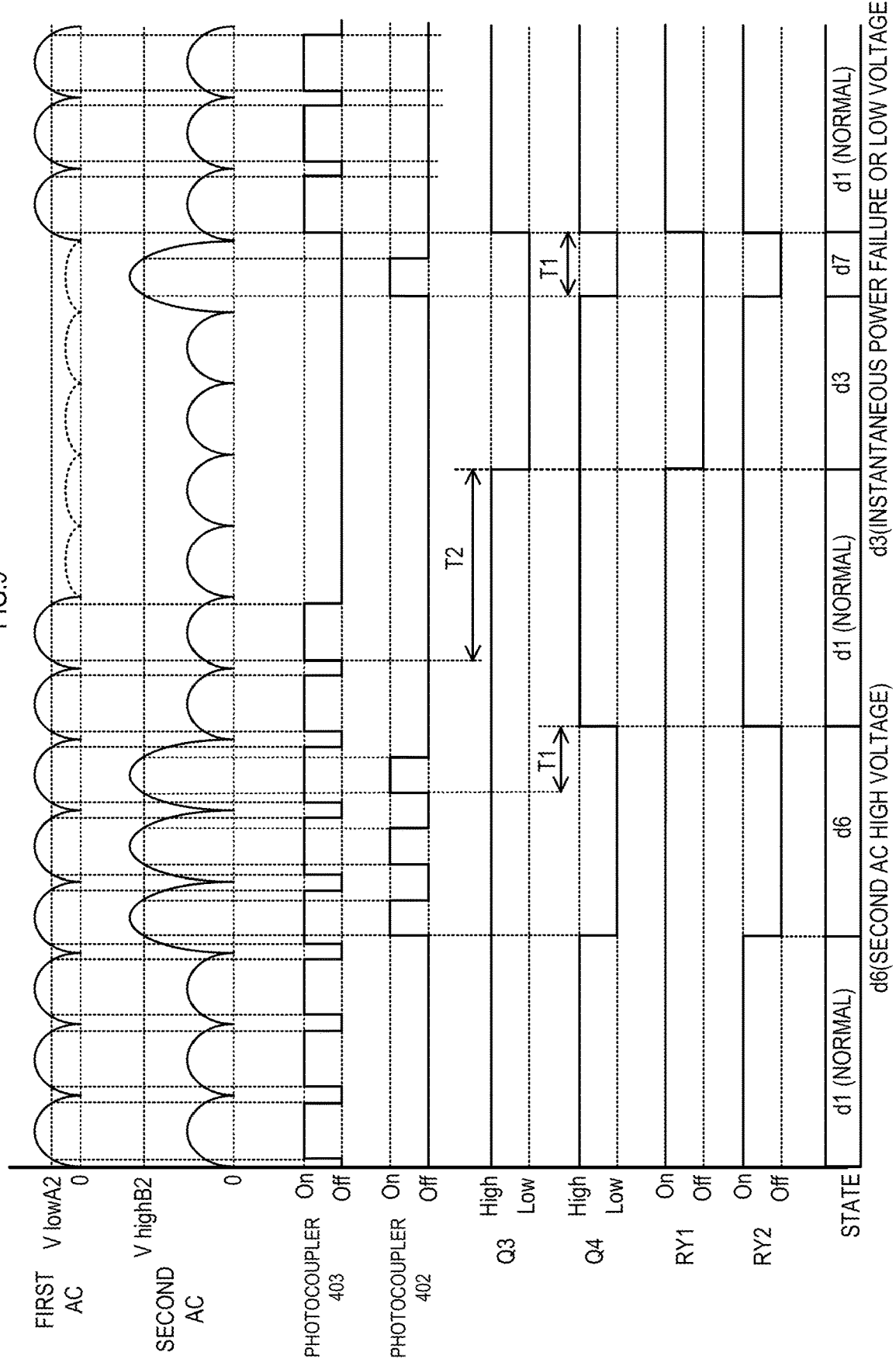

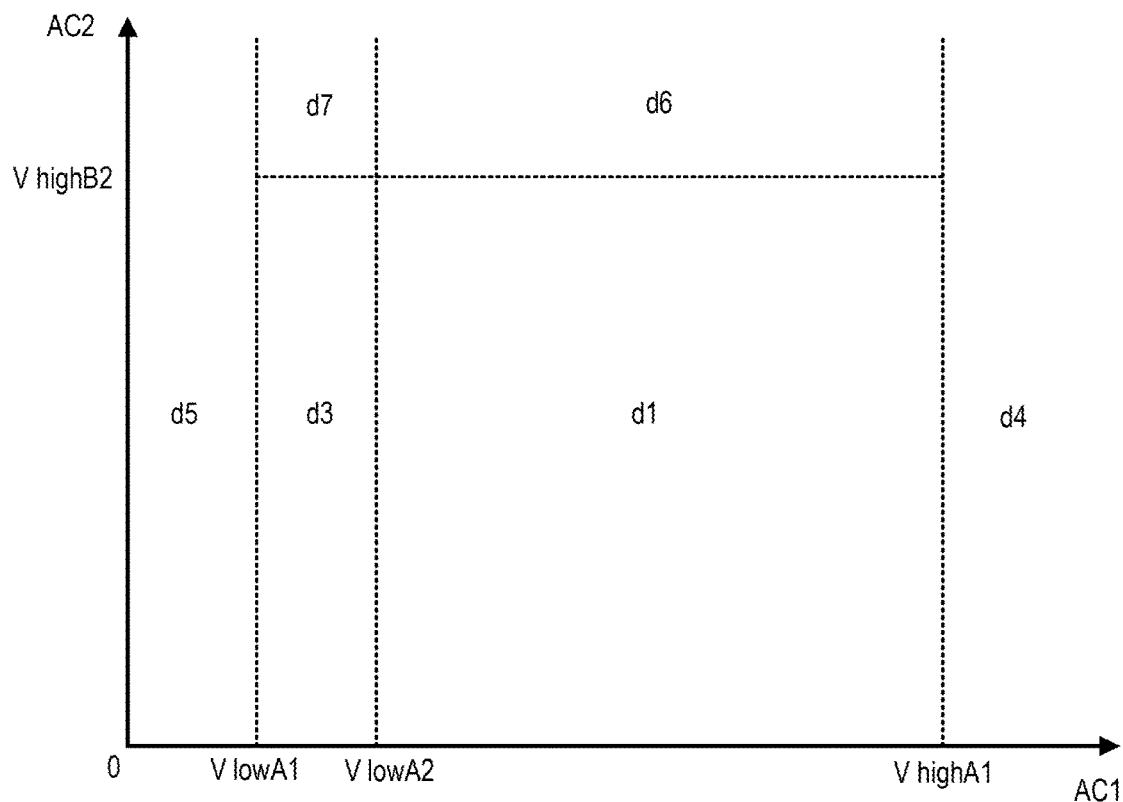

| STATE | Vcc | Q3 | Q4 | RY1 | RY2 | |
|---|---|---|---|---|---|---|
| d1 | On | High | High | On | On | NORMAL OPERATION |
| d3 | On | Low | High | Off | On | MAIN 1 IS PROTECTED ACCORDING TO DETECTION OF INSTANTANEOUS POWER FAILURE OR LOW VOLTAGE (VOLTAGE LESS THAN Vlow2 CONTINUES FOR PREDETERMINED TIME) |
| d6 | On | High | Low | On | Off | MAIN 2 IS PROTECTED ACCORDING TO DETECTION OF HIGH VOLTAGE (VhighB2) OF SECOND ALTERNATING CURRENT POWER SOURCE |
| d7 | On | Low | Low | Off | Off | MAIN 1 AND MAIN 2 ARE PROTECTED ACCORDING TO DETECTION OF INSTANTANEOUS POWER FAILURE OR LOW VOLTAGE OF FIRST ALTERNATING CURRENT POWER SOURCE AND DETECTION OF HIGH VOLTAGE OF SECOND ALTERNATING CURRENT POWER SOURCE |

FIG.14

| | Vcc | Q3 | Q4 | SWITCH 55 | SWITCH 56 | RY1 | RY2 | |
|---|---|---|---|---|---|---|---|---|
| d1 | On | High | High | On | On | On | On | MAIN 1 AND MAIN 2 ARE IN NORMAL OPERATION BECAUSE BOTH OF FIRST ALTERNATING CURRENT POWER SOURCE AND SECOND ALTERNATING CURRENT POWER SOURCE HAVE NORMAL VOLTAGE |
| d2 | On | High | High | On | On | Off | On | MAIN 1 IS PROTECTED (BY SOFTWARE) ACCORDING TO DETECTION OF HIGH VOLTAGE OF FIRST ALTERNATING CURRENT POWER SOURCE (MAIN 2 MAY BE OPERATED NORMALLY BECAUSE SECOND ALTERNATING CURRENT POWER SOURCE HAS NORMAL VOLTAGE) |
| d3 | On | Low | High | Off | On | Off | On | MAIN 1 IS PROTECTED (BY SOFTWARE) ACCORDING TO DETECTION OF INSTANTANEOUS POWER FAILURE OR LOW VOLTAGE OF FIRST ALTERNATING CURRENT POWER SOURCE (MAIN 2 MAY BE OPERATED NORMALLY BECAUSE SECOND ALTERNATING CURRENT POWER SOURCE HAS NORMAL VOLTAGE) |
| d6 | On | High | High | On | Off | On | On | MAIN 2 IS PROTECTED (BY SOFTWARE) ACCORDING TO DETECTION OF HIGH VOLTAGE (VhighB2) OF SECOND ALTERNATING CURRENT POWER SOURCE (MAIN 2 MAY BE OPERATED NORMALLY BECAUSE FIRST ALTERNATING CURRENT POWER SOURCE HAS NORMAL VOLTAGE) |
| d7 | On | Low | High | Off | Off | Off | On | MAIN 1 AND MAIN 2 ARE PROTECTED (BY SOFTWARE) ACCORDING TO DETECTION OF INSTANTANEOUS POWER FAILURE OR LOW VOLTAGE OF FIRST ALTERNATING CURRENT POWER SOURCE AND DETECTION OF HIGH VOLTAGE (VhighB2) OF SECOND ALTERNATING CURRENT POWER SOURCE |
| d8 | On | High | High | On | Off | On | On | MAIN 2 IS PROTECTED (BY SOFTWARE) ACCORDING TO DETECTION OF INSTANTANEOUS POWER FAILURE OR LOW VOLTAGE OF SECOND ALTERNATING CURRENT POWER SOURCE (MAIN 1 MAY BE OPERATED NORMALLY BECAUSE FIRST ALTERNATING CURRENT POWER SOURCE HAS NORMAL VOLTAGE) |

FIG. 15

| | Vcc | Q3 | Q4 | スイッチ55 | スイッチ56 | RY1 | RY2 | |
|---|---|---|---|---|---|---|---|---|
| d9 | On | Low | High | Off | Off | Off | On | MAIN 1 AND MAIN 2 ARE PROTECTED (BY SOFTWARE) ACCORDING TO DETECTION OF INSTANTANEOUS POWER FAILURE OR LOW VOLTAGE OF FIRST ALTERNATING CURRENT POWER SOURCE AND SECOND ALTERNATING CURRENT POWER SOURCE |
| d10 | On | High | Low | On | Off | On | Off | TRANSFORMER 72 IS PROTECTED (BY HARDWARE) ACCORDING TO DETECTION OF HIGH VOLTAGE (VhighB1) OF SECOND ALTERNATING CURRENT POWER SOURCE (MAIN 1 MAY BE OPERATED NORMALLY BECAUSE FIRST ALTERNATING CURRENT POWER SOURCE HAS NORMAL VOLTAGE) |
| d11 | On | Low | Low | Off | Off | Off | Off | MAIN 1 AND MAIN 2 ARE PROTECTED (BY SOFTWARE) AND TRANSFORMER 72 IS PROTECTED (BY HARDWARE) ACCORDING TO DETECTION OF INSTANTANEOUS POWER FAILURE OR LOW VOLTAGE OF FIRST ALTERNATING CURRENT POWER SOURCE AND DETECTION OF HIGH VOLTAGE (VhighB1) OF SECOND ALTERNATING CURRENT POWER SOURCE |
| d12 | On | High | High | On | Off | Off | Off | MAIN 1 AND MAIN 2 ARE PROTECTED (BY SOFTWARE) ACCORDING TO DETECTION OF HIGH VOLTAGE OF FIRST ALTERNATING CURRENT POWER SOURCE AND DETECTION OF INSTANTANEOUS POWER FAILURE OR LOW VOLTAGE OF SECOND ALTERNATING CURRENT POWER SOURCE |
| d13 | On | High | High | On | Off | Off | Off | MAIN 1 AND MAIN 2 ARE PROTECTED (BY SOFTWARE) ACCORDING TO DETECTION OF HIGH VOLTAGE OF FIRST ALTERNATING CURRENT POWER SOURCE AND DETECTION OF HIGH VOLTAGE (VhighB2) OF SECOND ALTERNATING CURRENT POWER SOURCE |
| d14 | On | High | High | On | Off | Off | Off | MAIN 1 IS PROTECTED (BY SOFTWARE) AND TRANSFORMER 72 IS PROTECTED (BY HARDWARE) ACCORDING TO DETECTION OF HIGH VOLTAGE OF FIRST ALTERNATING CURRENT POWER SOURCE AND DETECTION OF HIGH VOLTAGE (VhighB1) OF SECOND ALTERNATING CURRENT POWER SOURCE |

POWER SUPPLY CIRCUIT AND SOUND EQUIPMENT

CROSS REFERENCE TO RELATED APPLICATIONS

This Nonprovisional application claims priority under 35 U.S.C. § 119(a) on Patent Applications No. 2017-185602 filed in Japan on Sep. 27, 2017 the entire contents of which are hereby incorporated by reference.

BACKGROUND OF THE INVENTION

1. Field of the Invention

Preferred embodiments of the invention relate to a power supply circuit including a function for protecting various kinds of circuits that receive power supply and operate, and sound equipment including the power supply circuit.

2. Description of the Related Art

Japanese Unexamined Patent Publication No. H10-271668 (hereinafter, referred to as "Patent Literature 1") discloses the configuration in which a resistor for restricting inrush current is inserted to prevent the inrush current from flowing into a load after occurrence of instantaneous power failure.

SUMMARY OF THE INVENTION

In the invention of Patent Literature 1, it is not assumed that a load is protected from high voltage or low voltage in a situation other than instantaneous power failure. Accordingly, if a circuit whose operable voltage range is more narrowed (circuit is likely to break down due to high voltage or low voltage more than or less than a predetermined voltage range) is employed while operating a power source, the configuration of Patent Literature 1 can hardly protect the circuit.

One aspect of the present invention provides a power supply circuit capable of protecting a circuit whose operable voltage range is narrow while a power source is in operation, and sound equipment including the power supply circuit.

A power supply circuit in accordance with an exemplary embodiment of the present invention includes: an internal power source that receives power supply from an external power source; an abnormality detection circuit that receives power supply from the internal power source and detects abnormalities of the external power source; a protection target circuit that receives the power supply from the external power source; and a protection function unit that restricts electric power supplied to the protection target circuit to a predetermined range when the abnormality detection circuit detects the abnormalities.

Preferred embodiments of the present invention can protect the circuit whose operable voltage range is narrow while the power source is in operation.

The above and other elements, features, characteristics, and advantages of the present invention will become more apparent from the following detailed description of the preferred embodiments with reference to the attached drawings.

BRIEF DESCRIPTION OF THE DRAWINGS

FIG. 4 is an explanatory view showing an operation of the power supply circuit 1A;

FIG. 9 is an explanatory view showing an operation of the power supply circuit 2;

FIG. 10A is a schematic view showing a range of voltage;

FIG. 10B is a view showing an operational state;

FIG. 14 is a view showing an operational state; and

FIG. 15 is a view showing an operation state.

DETAILED DESCRIPTION OF THE PREFERRED EMBODIMENTS

Figure 1:
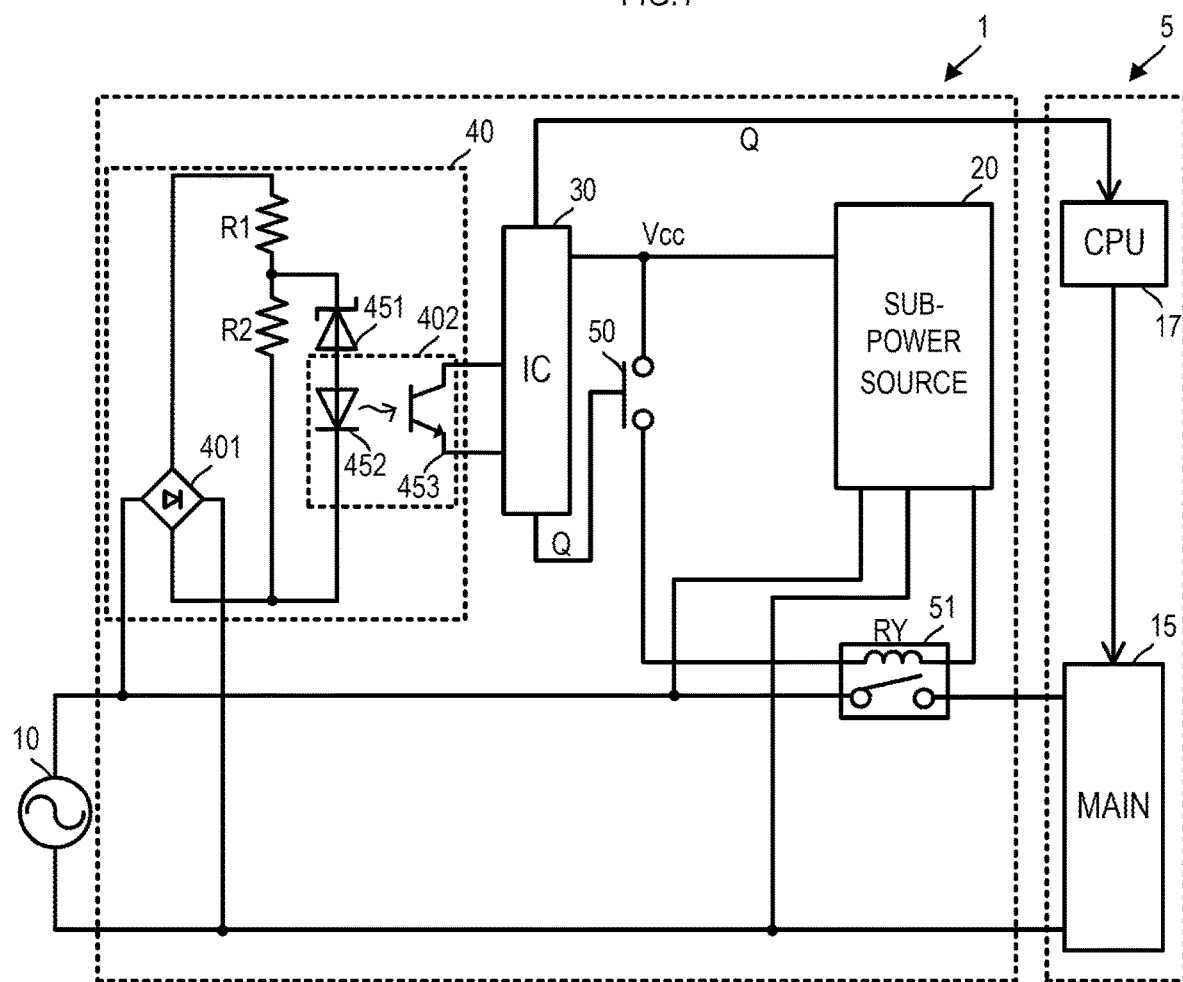
FIG. 1 is a block diagram showing a structure of a power supply circuit 1 in accordance with a first exemplary embodiment.

FIG. 1 is a circuit diagram showing a structure of a power supply circuit 1 in accordance with a first exemplary embodiment. The power supply circuit 1 is connected to an alternating current power source 10 such as a commercial power source, and sound equipment 5. As an example of FIG. 1, sound equipment 5 includes a main circuit 15 and a CPU 17. Note that, the power supply circuit 1 may be built in the sound equipment 5. Further, the power supply circuit 1 may be connected to various kinds of electric appliances other than the sound equipment, and may be built in various kinds of electric appliances other than the sound equipment.

The main circuit 15 is an example of a protection target circuit in the present invention. The alternating current power source 10 corresponds to an external power source that supplies electric power to the main circuit 15. The main circuit 15 has a power supply circuit (main power source) that generates predetermined direct current voltage from the alternating current power source 10, and includes a circuit that performs various kinds of processing (e.g., sound signal processing) by using the direct current voltage. The main circuit 15 is a power amplifier of the sound equipment, for example. Note that, the power supply circuit of the present invention is available for various kinds of electric appliances other than the sound equipment, and the main circuit 15 is not limited to the power amplifier of the sound equipment.

Power supply circuit 1 includes a sub-power source 20, an IC 30, a high voltage detection circuit 40, a switch 50, and a relay switch 51.

The sub-power source 20, which is an example of an internal power source, is connected to the alternating current power source 10, and receives power supply from the alternating current power source 10. The sub-power source 20 supplies electric power to the IC 30. Note that, the sub-power source 20 may supply electric power to other circuits (e.g., power amplifier), which are not shown. The IC 30 is a logic IC that outputs a "High" signal or a "Low" signal according to an input signal. For instance, the IC 30 constitutes a multi-vibrator that receives ON or OFF of the input signal as a trigger and outputs a pulse with a predetermined width (the "High" signal or the "Low" signal).

The sub-power source 20 drives the relay switch 51. The relay switch 51 is inserted between the alternating current power source 10 and the main circuit 15. The switch 50 is connected to a connecting line between the relay switch 51 and the sub-power source 20. The switch 50 is constituted by a switching element such as an FET or a transistor. When electric power is supplied from the sub-power source 20 and the switch 50 is turned on, the relay switch 51 is turned on. When the relay switch 51 is turned on, the alternating current power source 10 and the main circuit 15 are connected to each other.

When the alternating current power source 10 is turned off (or abnormally low voltage), the sub-power source 20 is stopped. Therefore, no power supply is supplied to the IC 30 and the relay switch 51 from the sub-power source 20, so that the relay switch 51 is turned off. When normal voltage is supplied from the alternating current power source 10 and the sub-power source 20 operates, electric power is supplied to the IC 30. The IC 30 turns on the switch 50, so that the relay switch 51 is turned on. Note that, the sub-power source 20 may include a function for detecting abnormally high voltage of an external power source. In this case, when electric power of the abnormally high voltage is supplied from the alternating current power source 10, the sub-power source 20 is stopped. Therefore, no power is supplied to the IC 30 and the relay switch 51 from the sub-power source 20, so that the relay switch 51 is turned off. The function of detecting the abnormally high voltage in the sub-power source 20 will be described later.

A high voltage detection circuit 40 is connected to the alternating current power source 10. The high voltage detection circuit 40 includes a rectification circuit 401, a photocoupler 402, a Zener diode 451, a resistor R1, and a resistor R2.

The rectification circuit 401 performs full-wave rectification of alternating current voltage of the alternating current power source 10. Predetermined voltage, which is divided by the resistor R1 and the resistor R2, is applied to the photocoupler 402.

The photocoupler 402 includes a light emitting diode 452 and a photo-transistor 453. When a voltage more than predetermined breakdown voltage is applied to the Zener diode 451, current flows through the Zener diode 451. A division ratio of the resistor R1 and the resistor R2 and the breakdown voltage of the Zener diode 451 are determined such that current flows through the Zener diode 451 when the voltage of the alternating current power source 10 is increased to abnormally high voltage more than a threshold (e.g., Vhigh in FIG. 2). When the current flows through the light emitting diode 452 and then the light emitting diode 452 emits light, the photo-transistor 453 is turned on. The photo-transistor 453 is connected to the IC 30. When the photo-transistor 453 is turned on, i.e., an output of the photocoupler 402 is changed into an on-state, the IC 30 turns off the switch 50.

Figure 2:
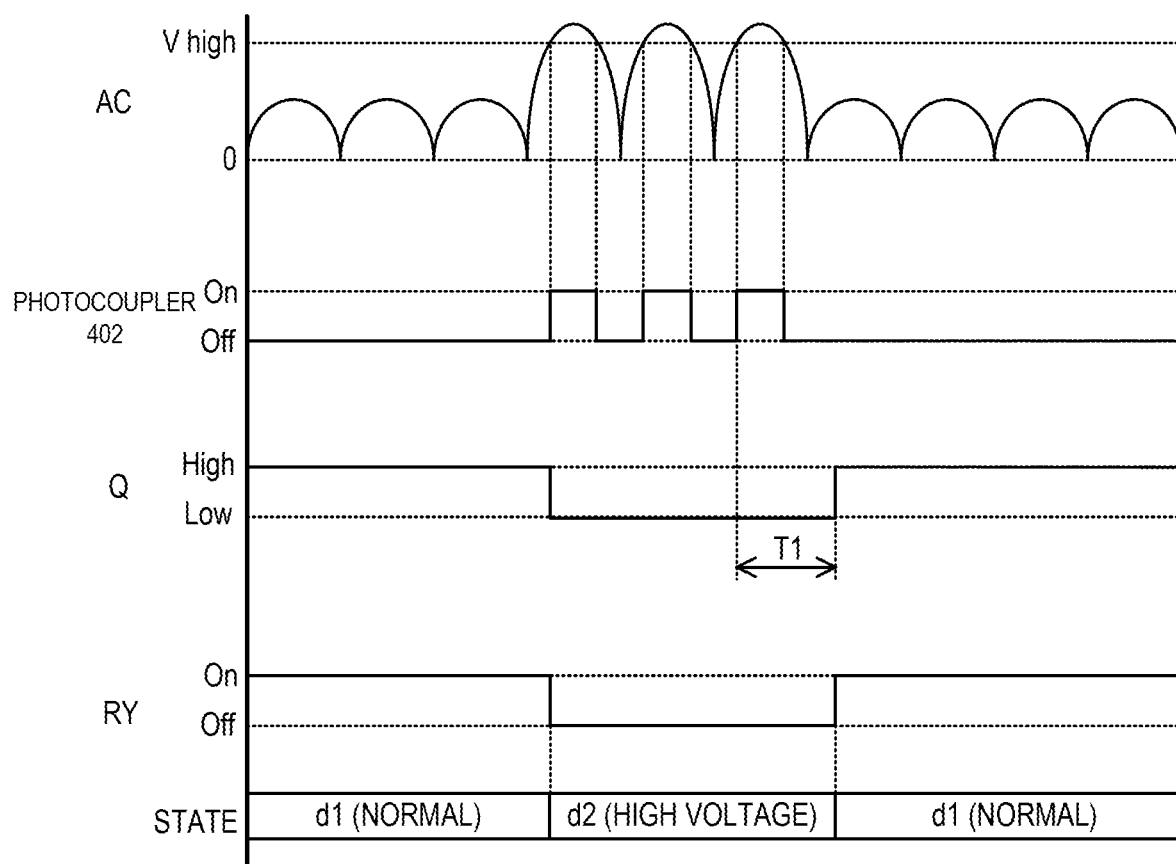
FIG. 2 is an explanatory view showing an operation of the power supply circuit 1.

FIG. 2 is a view showing an operation of the power supply circuit 1 according to time series. Note that, the most upper part of FIG. 2 shows a waveform obtained by full-wave rectification of power supply voltage, i.e., an absolute value of alternating current voltage (also the same in FIGS. 4, 9, and 12). As shown in FIG. 2, when the voltage (absolute value: hereinafter omitted) of the alternating current power source 10 is normal voltage, i.e., less than or equal to the predetermined voltage Vhigh, the photocoupler 402 is turned off and an output Q of the IC 30 is changed into a high level (High). In this case, the switch 50 is turned on, so that the relay switch 51 is turned on. Accordingly, electric power is supplied to the main circuit 15 from the alternating current power source 10.

On the other hand, when the voltage of the alternating current power source 10 is increased to abnormally high voltage more than the predetermined voltage Vhigh, the photocoupler 402 is turned off and the output Q of the IC 30 is changed into a low level (Low). In this case, the switch 50 is turned off, so that the relay switch 51 is turned off (RY=off). Accordingly, the power supply from the alternating current power source 10 to the main circuit 15 is intercepted.

In the example of FIG. 2, after predetermined time T1 elapses from when the output of the photocoupler 402 is changed into the on-state, the IC 30 turns on the switch 50, turns on the relay switch 51, and restarts the power supply from the alternating current power source 10 to the main circuit 15. If the output of the photocoupler 402 is changed into the on-state again before the predetermined time T1 elapses, the switch 50 will remain turned off. The predetermined time T1, which may take any values, is determined based on a cycle of the alternating current power source 10, for example. For instance, the predetermined time T1 may be determined to be a value larger than a half cycle of the alternating current power source 10. It is assumed that the predetermined time T1 is determined to be a half cycle of the alternating current power source 10. At the timing when rising up after the next half cycle, if the voltage (subjected to full-wave rectification) of the alternating current power source 10 indicates the normal voltage value, the IC 30 will turn on the switch 50, so that the relay switch 51 is turned on. Assumed that the predetermined time T1 is determined to be still longer than the half cycle, the IC 30 will be recovered after the power source is stabilized to some extent.

Note that, the output Q of the IC 30 is also announced to a CPU 17. The CPU 17 monitors the output Q of the IC 30. When the output Q is in the high level, the CPU 17 determines that the state of the alternating current power source 10 is in a state d1 (normal). When the output Q is in the low level (Low), the CPU 17 determines that the state of the alternating current power source 10 is in a state d2 (high voltage).

The CPU 17 reads out a program from a memory (not shown) and performs predetermined operation. For instance, the CPU 17 supervises the output Q of the IC 30 and monitors a power source state of the alternating current power source 10. When the power source state of the alternating current power source 10 is the abnormally high voltage (in the state d2), the CPU 17 stops the main circuit 15, for example. Further, in the state d2, the CPU 17 may transmit a control signal for turning off the relay switch 51.

Furthermore, if the main circuit 15 is a power amplifier, the CPU 17 will lower a sound signal level of the power amplifier. According to instructions of the CPU 17, the main circuit 15 may lower the sound signal level gradually to perform mute processing. In this case, when abnormalities occur in the alternating current power source 10 and the power source is intercepted, the CPU 17 fades out sounds corresponding to the sound signal. This makes it possible to prevent the occurrence of unexpected noises.

Note that, since the CPU 17 receives power supply from the sub-power source 20, the CPU 17 can operate even if the power supply to the main circuit 15 is intercepted. Accordingly, in the state d2, when the voltage of the alternating current power source 10 is returned back to the normal state after the main circuit 15 is stopped (or the relay switch 51 is turned off), the main circuit 15 can be recovered (or the relay switch 51 can be turned on).

As mentioned above, the IC 30 and the high voltage detection circuit 40, which receive power supply from the sub-power source 20, function as an abnormality detection circuit that detects abnormalities of alternating current power source 10 serving as an external power source. Further, the IC 30, the switch 50, and the relay switch 51 correspond to a protection function unit. The protection unit restricts the voltage applied to the main circuit 15, which serves as a protection target circuit, to a predetermined range when the abnormality detection circuit detects abnormalities of the alternating current power source 10. The protection function unit can also be achieved by software of the CPU 17. In this case, the CPU 17 operates the software to turn off the relay switch 51 when determining that the state of the alternating current power source 10 is in the state d2.

Since receiving power supply from the sub-power source 20 to operate, the abnormality detection circuit and the protection function unit can protect a circuit (main circuit 15) with a lower breakdown voltage, while operating the sub-power source 20. Further, even when the high voltage detection circuit 40 detects power-source abnormalities of the alternating current power source 10 and intercepts the power supply to the main circuit 15, electric power remains supplied to the IC 30 from the sub-power source 20. Accordingly, when the voltage of the alternating current power source 10 is returned back to the normal state, the abnormality detection circuit and the protection function unit each can be recovered by itself.

Figure 3:
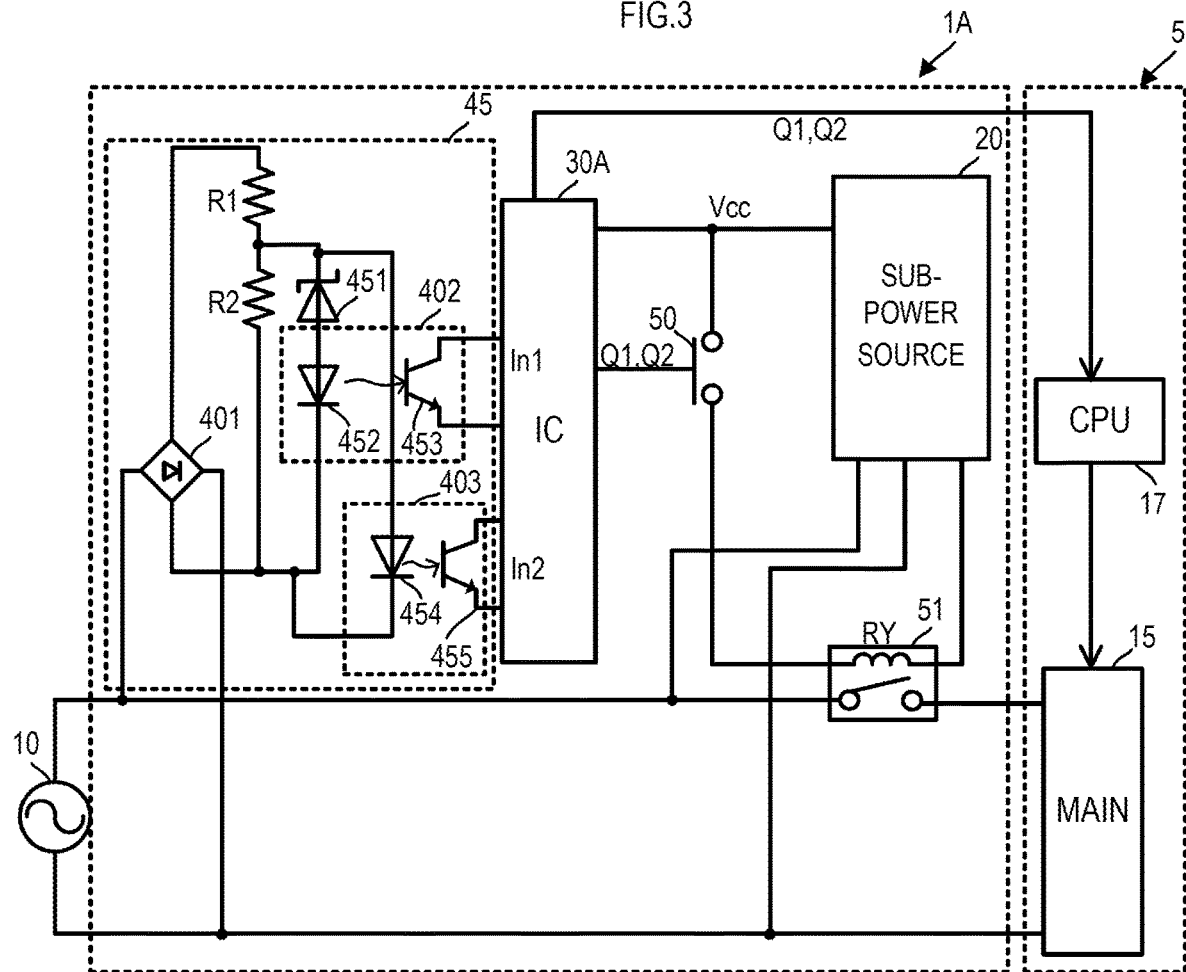
FIG. 3 is a block diagram showing a structure of a power supply circuit 1A in accordance with a second exemplary embodiment.

Subsequently, FIG. 3 is a circuit diagram showing a structure of a power supply circuit 1A in accordance with a second exemplary embodiment. Note that, the same reference numerals are assigned to the same components as in FIG. 1, and the description thereof is omitted.

In the exemplary embodiment, the power supply circuit 1A includes a voltage abnormality detection circuit 45, instead of the high voltage detection circuit 40. The voltage abnormality detection circuit 45 includes a photocoupler 403 connected in parallel with a photocoupler 402.

The photocoupler 403 includes a light emitting diode 454 and a photo-transistor 455. A division ratio of the resistance R1 and the resistance R2 is determined such that current flows through the light emitting diode 454 when the voltage of the alternating current power source 10 is normal voltage (more than predetermined voltage VLow). Besides, a resistor may be further inserted, as necessary, to achieve such a situation that the light emitting diode 454 emits light when the voltage of the alternating current power source 10 is the normal voltage. When the light emitting diode 454 emits light, the photo-transistor 455 is turned on. The photo-transistor 455 is connected to an IC 30A.

The IC 30A has two or more inputs (a first input In1 and a second input In2). The photocoupler 402 is connected to the first input In1. The photocoupler 403 is connected to the second input In2. When the photo-transistor 453 is turned on and the output of the photocoupler 402 is changed into the on-state, the IC 30A turns off a switch 50. Further, when the photo-transistor 455 is turned on, i.e., the output of the photocoupler 403 is changed into an on-state, the IC 30A also turns off the switch 50. The IC 30A outputs an output Q1 in response to the first input In1, and outputs an output Q2 in response to the second input In2.

FIG. 4 is a view showing an operation of the power supply circuit 1A according to time series. As shown in FIG. 4, when the voltage of the alternating current power source 10 is normal voltage, i.e., less than or equal to predetermined voltage Vhigh2, the photocoupler 402 is turned off, so that the output Q1 of the IC 30A is changed into a high level (High). When the voltage of the alternating current power source 10 is increased to abnormally high voltage more than the predetermined voltage Vhigh2, the photocoupler 402 is turned on, so that the output Q1 of the IC 30A is changed into a low level (Low), like the example of FIG. 2. In this case, the switch 50 is turned off and thereby the relay switch 51 is turned off (RY=off). Accordingly, power supply from the alternating current power source 10 to the main circuit 15 is intercepted.

When the voltage of the alternating current power source 10 exceeds predetermined voltage Vlow2, the photocoupler 403 is turned on. The IC 30A maintains the output Q2 at a high level (High) until predetermined time T2 elapses from when the photocoupler 403 is turned on. In other words, when the output of the photocoupler 403 is changed into the on-state again before the predetermined time T2 elapses, the IC 30A maintains the output Q2 at the high level. Accordingly, the IC 30A turns on the switch 50, so that the relay switch 51 is turned on (RY=On).

Even if the predetermined time T2 has elapsed, when the output of the photocoupler 403 remains in an off-state, the IC 30A changes the output Q2 into a low level (Low). In this case, the switch 50 is turned off and thereby the relay switch 51 is turned off (RY=Off). Therefore, the power supply from the alternating current power source 10 to the main circuit 15 is intercepted.

The predetermined time T2 is also determined based on, for example, a cycle of the alternating current power source 10. For instance, the predetermined time T2 is determined to be one cycle of the alternating current power source 10, or two or more cycles thereof. If the main circuit 15 is a circuit for processing a sound signal, the predetermined time T2 will be determined, considering time enough to fade out sounds corresponding to the sound signal.

When the output of the photocoupler 403 is changed into the on-state, the IC 30A changes the output Q2 into the high level. The IC 30A turns on the switch 50, so that the relay switch 51 is turned on (RY=On). If the IC 30A is recovered after the alternating current power source 10 is subjected to instantaneous power failure or abnormally low voltage, the IC 30A will change the output Q2 into the high level immediately. Thus, the power supply to the main circuit 15 is restarted. Even if the IC 30A is recovered after the alternating current power source 10 is subjected to instantaneous power failure or abnormally low voltage, however, the IC 30A may change the output Q2 into the high level after the predetermined time has elapsed.

Further, the outputs Q1 and Q2 of the IC 30A are also announced to the CPU 17. The CPU 17 monitors the output Q1 and the output Q2 of the IC 30A. When the output Q1 and the output Q2 of the IC 30A are in the high level, the CPU 17 determines that the power source is in a state d1 (normal). When the output Q1 of the IC 30A is in the low level, the CPU 17 determines that the power source is in a state d2 (high voltage). Further, when the output Q2 of the IC 30A is in the low level, the CPU 17 determines that the power source is in a state d3 (instantaneous power failure or the low voltage).

In the state d3, the CPU 17 may stop the main circuit 15. Further, in the state d3, the CPU 17 may transmit a control signal for turning off the relay switch 51. As mentioned above, if the main circuit 15 is a power amplifier, the CPU 17 may lower a sound signal level of the power amplifier in the state d3. According to instructions of the CPU 17, the main circuit 15 may lower the sound signal level gradually to perform mute processing. In this case, when abnormalities occur in the alternating current power source 10 and the power source is intercepted, the CPU 17 fades out sounds corresponding to the sound signal. This makes it possible to prevent the occurrence of unexpected noises.

Further, when the power source state is changed into the state d1 after the state d3, the CPU 17 preferably turns on an inrush-current prevention function in the main circuit 15. The inrush-current prevention function is achieved, for example, by inserting a resistor into a previous stage of the protection target circuit. When the voltage of the alternating current power source 10 is returned back to the normal voltage and rectification voltage is stabilized, the CPU 17 short-circuits both ends of the resistor, thereby releasing the inrush current prevention function.

Note that, the IC 30A may change the output Q2 into the low level before the predetermined time T2 elapses and intercept the power supply to the main circuit 15. Even if the main circuit 15 in the subsequent stage of the alternating current power source 10 is in some degree of low voltage state, however, when the main circuit 15 is allowed to operate continuously, the power supply may be continued until the predetermined time elapses. Further, like sound equipment, if the main circuit 15 is likely to make noise sounds when power supply is stopped instantaneously, the power supply will preferably be continued until the predetermined time elapses.

Figures 5A, 5B:
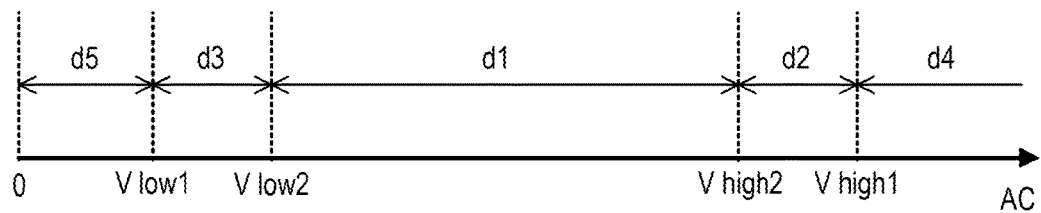
FIG. 5A is a schematic view showing a range of voltage.
FIG. 5B is a view showing an operational state.

FIG. 5A is a schematic view showing a range of voltage, and FIG. 5B is a view showing an operation state. First, when the alternating current power source 10 is in an off-state, or is in a state d5 that is decreased to abnormally low voltage (less than or equal to Vlow1), the sub-power source 20 is stopped, so that Vcc is dropped to 0 V and the relay switch 51 is turned off (RY=Off). When normal voltage (raging from Vlow1 to Vhigh1) is supplied from the alternating current power source 10, the sub-power source 20 operates (turned into Vcc=ON).

However, when the voltage of the alternating current power source 10 exceeds Vhigh2 and the output of the photocoupler 402 is changed to the on-state, the IC 30A changes the output Q1 into the low level and turns off relay switch 51 (RY=Off). In the state d2, the main circuit 15 in the subsequent stage of the alternating current power source 10 is protected from the high voltage. In this case, since an abnormality detection circuit (circuit achieved by the IC 30A and the voltage abnormality detection circuit 45) detects high voltage more than Vhigh2, the IC 30A turns off the switch 50, so that the relay switch 51 is turned off (RY=Off) (or the CPU 17 operates software to turn off the relay switch 51).

Further, even if the sub-power source 20 is in operation, when the alternating current power source 10 is subjected to instantaneous power failure or abnormally low voltage, the IC 30A changes the output Q2 into the low level, so that the relay switch 51 is turned off (RY=Off). In the state d3, the main circuit 15 in the subsequent stage of the alternating current power source 10 is protected from the instantaneous power failure or the low voltage. In this case, since a state of the low voltage less than or equal to Vlow2 continues for a predetermined time, the abnormality detection circuit (a circuit achieved by the IC 30A and the voltage abnormality detection circuit 45) causes the IC 30A to turn off the switch 50, so that the relay switch 51 is turned off (RY=Off) (or the CPU 17 turns off the relay switch 51 as operation of software).

The voltage Vlow2 at which the output of the photocoupler 403 is changed into the off-state is higher than voltage Vlow1 at which the sub-power source 20 is stopped, and the voltage Vhigh2 at which the output of the photocoupler 402 is changed into the on-state is lower than the voltage Vhigh1 at which the sub-power source 20 is stopped. Therefore, the power supply circuit 1A is allowed to protect a circuit (main circuit 15) whose operable voltage range is more narrowed, while operating the sub-power source 20. Further, even if the voltage abnormality detection circuit 45 detects power source abnormalities of the alternating current power source 10 and intercepts the power supply to the main circuit 15, electric power remains supplied to the IC 30 from the sub-power source 20. As a result, when the abnormalities of the alternating current power source 10 are removed, the abnormality detection circuit and the protection function unit each can be recovered by itself.

Figure 6:
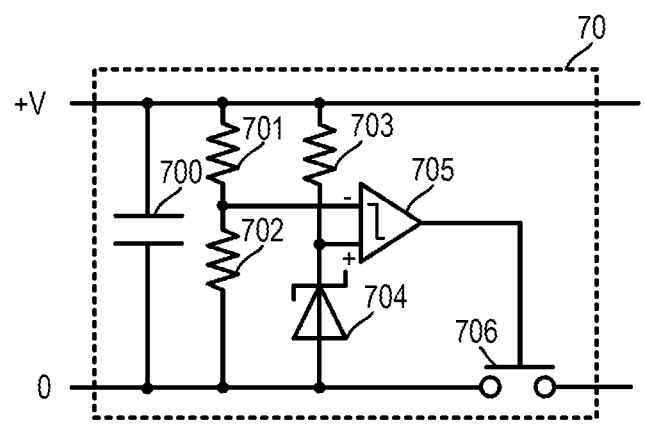
FIG. 6 is a circuit diagram when a transformer is employed as a protection target circuit.

Subsequently, a function of detecting the high voltage by using the sub-power source 20 will be described. FIG. 6 is a circuit diagram showing a structure of a high voltage detection circuit 70 in the sub-power source 20.

The high voltage detection circuit 70 includes a capacitor 700, a resistor 701, a resistor 702, a resistor 703, a Zener diode 704, a comparator 705, and a switch 706. The high voltage detection circuit 70 is connected to an input side (alternating current power source 10 side) of the sub-power source 20. Note that, the high voltage detection circuit 70 is connected to the subsequent stage of a rectifier circuit (not shown), and receives rectified voltage (+V).

The capacitor 700 is connected to the alternating current power source 10 via the rectifier circuit, and smooths a voltage variation in the alternating current power source 10. Breakdown voltage of the capacitor 700 is higher than that of a subsequent circuit (circuit of the sub-power source 20), and the capacity thereof is smaller than that of a capacitor (not shown) used in the subsequent circuit. Thus, the high voltage detection circuit 70 can detect the voltage variation before the subsequent circuit does, and protects the subsequent circuit.

The resistor 703 and the Zener diode 704 constitute a constant voltage circuit. A positive input side of the comparator 705 is connected between the resistor 703 and the Zener diode 704. Accordingly, constant voltage (reference voltage) is inputted to the positive input side of the comparator 705. The reference voltage corresponds to the abnormally high voltage (Vhigh) in the alternating current power source 10. Further, predetermined voltage (detection target voltage) divided by the resistor 701 and the resistor 702 is inputted to a negative input side of the comparator 705.

When the detection target voltage is less than the reference voltage, an output of the comparator 705 is changed into a high level. When the detection target voltage is more than or equal to the reference voltage, the output of the comparator 705 is changed into a low level. When the output of comparator 705 is changed into the low level, the switch 706 is turned off. Therefore, the power supply from the alternating current power source 10 to sub-power source 20 is intercepted. Thus, when the voltage of the alternating current power source 10 is increased to the abnormally high voltage (Vhigh), the high voltage detection circuit 70 stops the sub-power source 20.

Figure 7:
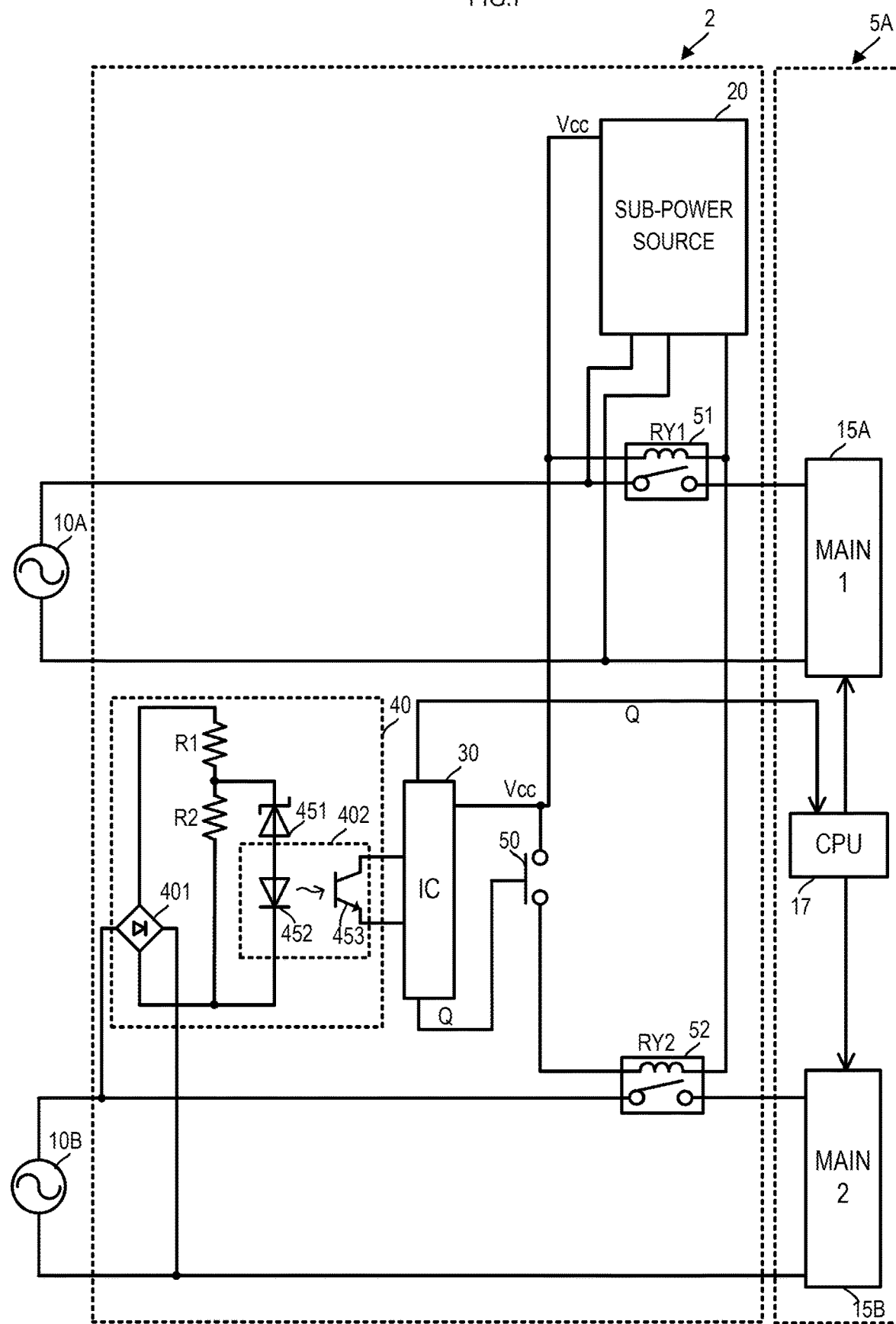
FIG. 7 is a circuit diagram showing a structure of a power supply circuit 2 in accordance with a third exemplary embodiment.

Subsequently, FIG. 7 is a circuit diagram showing a structure of a power supply circuit 2 in accordance with a third exemplary embodiment. Note that, the same reference numerals are assigned to the same components as in FIG. 1, and the description thereof is omitted.

The power supply circuit 2 is connected to a first alternating current power source 10A, a second alternating current power source 10B, and sound equipment 5A. Note that, the power supply circuit 2 may be built in various kinds of electric appliances such as sound equipment.

The sound equipment 5A includes a CPU 17, a first main circuit 15A, and a second main circuit 15B. The first main circuit 15A and the second main circuit 15B each are an example of the protection target circuit in the present invention. The first main circuit 15A and the second main circuit 15B each have a power supply circuit (a first main power source and a second main power source) that generates predetermined direct current voltage from a corresponding one of the first alternating current power source 10A and the second alternating current power source 10B, and include a circuit that performs various kinds of processing (e.g., sound signal processing) by using the direct current voltage. The first main circuit 15A and the second main circuit 15B each are, for example, a power amplifier of the sound equipment. The first alternating current power source 10A corresponds to a first external power source that supplies electric power to the first main circuit 15A. The second alternating current power source 10B corresponds to a second external power source that supplies electric power to the second main circuit 15B.

The sub-power source 20 receives power supply from the first alternating current power source 10A serving as the first external power source. The sub-power source 20 drives the relay switch 51. The relay switch 51 is inserted between the first alternating current power source 10A and the first main circuit 15A. When the relay switch 51 is turned on, the first alternating current power source 10A and the first main circuit 15A are connected to each other.

The high voltage detection circuit 40 is connected to the second alternating current power source 10B. Further, the sub-power source 20 drives a relay switch 52. The relay switch 52 is inserted between the second alternating current power source 10B and the second main circuit 15B. When the relay switch 52 is turned on, the second alternating current power source 10B and the second main circuit 15B are connected to each other. When the sub-power source 20 is stopped, power supply from the second alternating current power source 10B to the second main circuit 15B is also intercepted.

In the example, the high voltage detection circuit 40 and the IC 30 function as an abnormality detection circuit that detects power source abnormalities of the second alternating current power source 10B. Further, the IC 30, the switch 50, and the relay switch 52, when detecting the abnormalities of the second alternating current power source 10B, function as a protection function unit which restricts the voltage applied to the second main circuit 15B which serves as a protection target circuit to a predetermined range.

In this case, the sub-power source 20 detects power source abnormalities of the first alternating current power source 10A, and the high voltage detection circuit 40 and the IC 30 detect power source abnormalities of the second alternating current power source 10B. The sub-power source 20 includes the high voltage detection circuit 70 shown in FIG. 6. When the voltage of the first alternating current power source 10A is increased to the abnormally high voltage, the high voltage detection circuit 70 stops the sub-power source 20. Further, when the voltage of the first alternating current power source 10A is decreased to the abnormally low voltage, the sub-power source 20 is stopped. When the sub-power source 20 is stopped, the relay switch 51 is turned off, and the power supply from the first alternating current power source 10A to the first main circuit 15A is intercepted. Further, when the sub-power source 20 is stopped, power supply to the relay switch 52 is intercepted, so that the relay switch 52 is turned off. In this case, the power supply from the second alternating current power source 10B to second main circuit 15B is also intercepted.

When the voltage of the second alternating current power source 10B is increased to high voltage, the power supply circuit 2 of the third exemplary embodiment can intercept the power supply to the second main circuit 15B, while operating the sub-power source 20. Accordingly, the power supply circuit 2 can protect a circuit (second main circuit 15B) whose operable voltage range is narrower than that of the sub-power source 20. Further, when the abnormalities of the second alternating current power source 10B is removed, the high voltage detection circuit 40 and the IC 30 each can be recovered by itself.

Furthermore, when abnormalities occur in the first alternating current power source 10A, the sub-power source 20 is stopped, so that the power supply to the first main circuit 15A is intercepted, and the power supply to the second main circuit 15B is also intercepted. In this way, by using only one sub-power source 20, the power supply circuit 2 can detect abnormalities of a plurality of alternating current power sources individually, and can protect a circuit in the subsequent stage of each of the plurality of alternating current power sources. In other words, in a circuit required for connecting with a plurality of power sources, by using one sub-power source 20, the power supply circuit 2A protects not only a power source (first alternating current power source 10A) to which the sub-power source 20 is connected, but also a power source (second alternating current power source 10B) of a power line provided separately from the power source (first alternating current power source 10A) connected to the sub-power source 20. Further, by using the power supply from the sub-power source 20, the circuit that detects abnormalities of the second alternating current power source 10B and protects the second main circuit 15B can be protected and recovered by itself.

Note that, also in the example, the output Q of the IC 30 may be inputted to the CPU 17. According to the output Q of the IC 30, the CPU 17 may operate software to turn off the switch 50 and thereby turn off the relay switch 51, when determining that abnormalities occur in the second alternating current power source 10B. Further, if the second main circuit 15B is a power amplifier, the CPU 17 may lower a sound signal level to fade out sounds in the second main circuit 15B, when determining that abnormalities occur in the second alternating current power source 10B.

Figure 8:
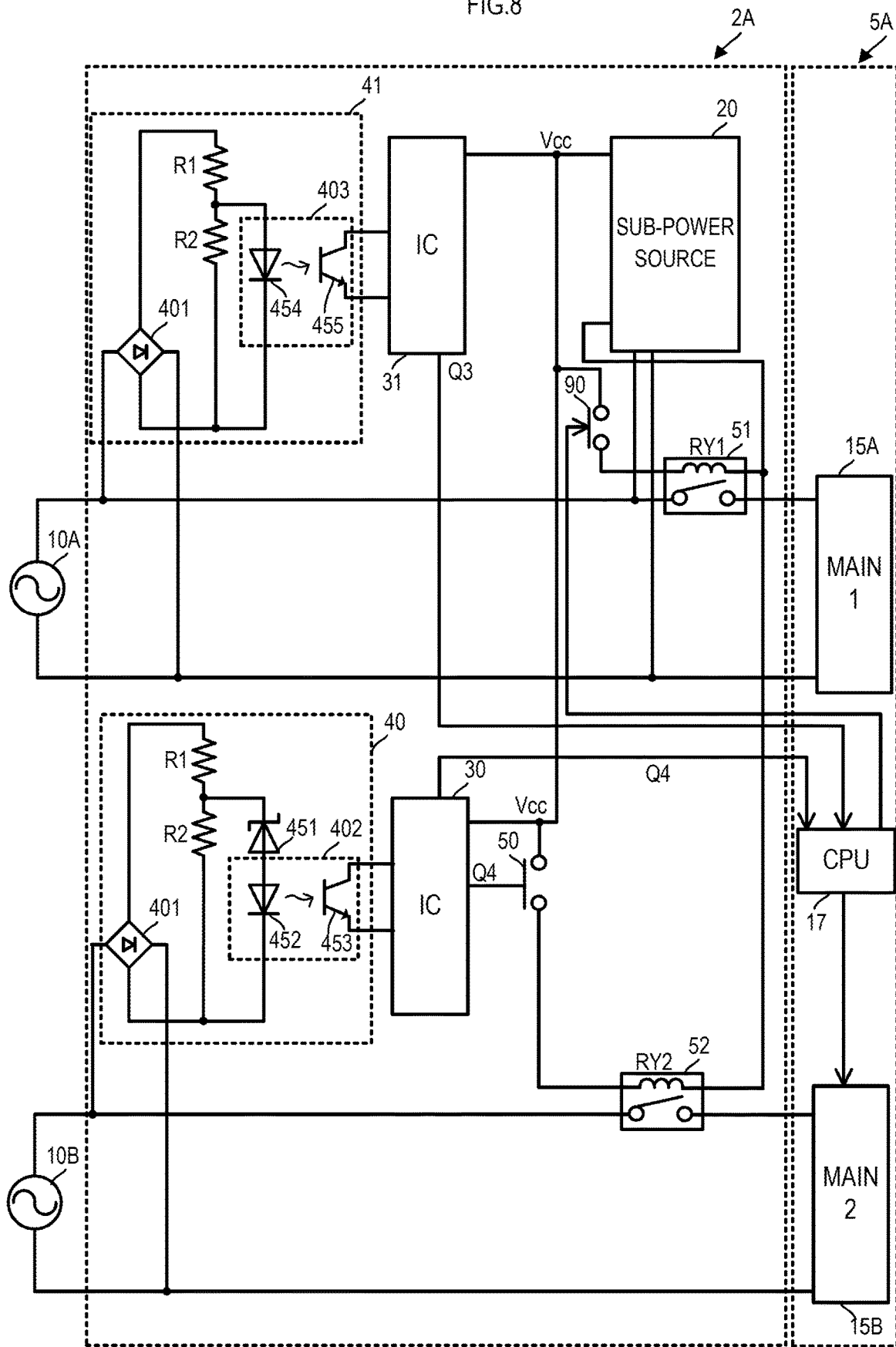
FIG. 8 is a circuit diagram showing a structure of a power supply circuit 2A in accordance with a fourth exemplary embodiment.

Subsequently, FIG. 8 is a circuit diagram showing a structure of a power supply circuit 2A in accordance with a fourth exemplary embodiment. Note that, the same reference numerals are assigned to the same components as in the power supply circuit 2 of FIG. 7, and the description thereof is omitted. The power supply circuit 2A further includes an IC 31, an instantaneous power failure detection circuit 41, and a switch 90. In addition to the structure of the power supply circuit 2 in FIG. 7, the power supply circuit 2A shown in FIG. 8 further includes the instantaneous power failure detector circuit 41, which is added to a power line of the first alternating current power source 10A. Thus, the power supply circuit 2A can protect the first main circuit 15A from instantaneous power failure or the low voltage, while operating the sub-power source 20.

The sub-power source 20 supplies electric power to the IC 31. The instantaneous power failure detection circuit 41 is connected to a first alternating current power source 10A. The instantaneous power failure detection circuit 41 includes a rectifier circuit 401, a photocoupler 403, a resistor R1, and a resistor R2. The photocoupler 403 includes a light emitting diode 454 and a photo-transistor 455, like the example shown in FIG. 3. When predetermined voltage (normal voltage) is applied to the photocoupler 403 from the first alternating current power source 10A, predetermined current flows into the light emitting diode 454, so that the photo-transistor 455 is turned on. The photocoupler 403 is connected to the IC 31.

The sub-power source 20 drives the relay switch 51. The switch 90 is connected between the sub-power source 20 and the relay switch 51. The CPU 17 turns on or turns off the switch 90. When the switch 90 is turned on, the relay switch 51 is turned on, so that electric power is supplied to the first main circuit 15A. When the switch 90 is turned off, the relay switch 51 is turned off, so that the power supply to the first main circuit 15A is intercepted.

FIG. 9 is a view showing an operation of the power supply circuit 2A according to time series. As shown in FIG. 9, when the voltage of the first alternating current power source 10A exceeds predetermined voltage VlowA2, the photocoupler 403 is turned on. The IC 31 maintains an output Q3 at a high level (High) until predetermined time T2 elapses from when the photocoupler 403 is turned on. In other words, if an output of the photocoupler 403 is returned back to an on-state before the predetermined time T2 elapses, the IC 31 will maintain the output Q3 at the high level.

Even if the predetermined time T2 elapses, when the output of the photocoupler 403 remains in an off-state, the IC 31 changes the output Q3 into a low level (Low). The CPU 17 supervises the output of the IC 31. When the output Q3 is changed into the low level, the CPU 17 turns off the switch 90. Accordingly, the relay switch 51 is turned off (RY1=Off). Even if the relay switch 51 is turned off, electric power remains supplied to the IC 31 because the sub-power source 20 is in operation, but the power supply from the first alternating current power source 10A to the first main circuit 15A is intercepted. Even if the power supply from the first alternating current power source 10A to the first main circuit 15A is intercepted, the first alternating current power source 10A is monitored by the IC 31 and the CPU 17. Therefore, when the output Q3 of the IC 31 is returned back to the high level from the low level, the power supply from the first alternating current power source 10A to the first main circuit 15A is restarted.

On the other hand, when the voltage of the second alternating current power source 10B is normal voltage which less than or equal to predetermined voltage VhighB, the photocoupler 402 is turned off, so that an output Q4 of the IC 30 is changed into a high level (High). When the voltage of the second alternating current power source 10B is increased to abnormally high voltage which more than predetermined voltage VhighB2, the photocoupler 402 is turned on, so that the output Q4 of the IC 30 is changed into a low level (Low). In this case, the switch 50 is turned off and thereby the relay switch 52 is turned off (RY2=Off). Accordingly, power supply from the second alternating current power source 10B to the second main circuit 15B is intercepted. In this case, even though the sub-power source 20 is in operation and electric power remains supplied to the IC 30, the IC 30 intercepts the power supply from the second alternating current power source 10B to the second main circuit 15B. Even if the power supply from the second alternating current power source 10B to the second main circuit 15B is intercepted, electric power remains supplied to the IC 30 from the sub-power source 20. Therefore, when the output Q4 of the IC 30 is returned back to the high level from the low level, the power supply from the second alternating current power source 10B to the second main circuit 15B is restarted. Consequently, by using the power supply from the sub-power source 20, the configuration that detects abnormal voltage on a second alternating current power source 10B side and protects the subsequent circuit can be protected and recovered by itself.

FIG. 10A is a schematic view showing a range of voltage, and FIG. 10B is a view showing an operation state. When the first alternating current power source 10A is in an off-state, or is in a state d5 that is decreased to abnormally low voltage (less than or equal to VlowA1), the sub-power source 20 is stopped, so that Vcc is dropped to 0 V the relay switch 52 and the relay switch 51 are turned off (RY1=Off, RY2=Off). When normal voltage (ranging from VlowA1 to VhighA1) is supplied from the first alternating current power source 10A, the sub-power source 20 operates (changed into Vcc=On).

Even if the sub-power source 20 is in operation (in the case of Vcc=On), the first alternating current power source 10A is in a state d3 or a state d7 that is subjected to instantaneous power failure or abnormally low voltage, the IC 31 changes the output Q3 into the low level, so that the CPU 17 turns off the switch 90 and the relay switch 51 is turned off (RY1=Off). As a result, the power supply from the first alternating current power source 10A to the first main circuit 15A is intercepted.

Further, in a state d4 that is electric power more than abnormally high voltage (VhighA1) is supplied from the first alternating current power source 10A, the sub-power source 20 is stopped. In this case, the relay switch 51 is turned off (RY1=Off) and the relay switch 52 is also turned off (RY2=Off). In this case, the circuits in the subsequent stage of the first alternating current power source 10A and the second alternating current power source 10B are banned to receive power supply.

Further, even if the sub-power source 20 is in operation (in the case of Vcc=On), when the voltage of the second alternating current power source 10B exceeds VhighB2 and an output of the photocoupler 402 is changed into an on-state, the IC 30 changes an output Q4 into a low level and turns off the switch 50, so that the relay switch 52 is turned off. In a state d6, power supply from the second alternating current power source 10B to the second main circuit 15B is intercepted, so that the second main circuit 15B (MAIN2) is protected from the high voltage. Further, in a state d7, the power supply from the first alternating current power source 10A to the first main circuit 15A is intercepted, and the power supply from the second alternating current power source 10B to the second main circuit 15B is intercepted. In other words, in the state d7, the first main circuit 15A is protected from instantaneous power failure or the low voltage, and the second main circuit 15B (MAIN2) is protected from the high voltage. In all of the states d1, d3, d6, and d7, the sub-power source 20 is in operation. Therefore, the power supply circuit 2A can protect a circuit (first main circuit 15A and second main circuit 15B) whose operable voltage range is narrower than that of the sub-power source 20, while operating the sub-power source 20.

In this way, by using only one sub-power source 20, the power supply circuit 2A can detect abnormalities of a plurality of alternating current power sources individually, and can protect a circuit in the subsequent stage of each of the plurality of alternating current power sources. In other words, the power supply circuit 2A is useful in a circuit required for connecting with a plurality of power sources. By using one sub-power source 20, the power supply circuit 2A protects not only a power source (first alternating current power source 10A) to which the sub-power source 20 is connected, but a power source (second alternating current power source 10B) of a power line provided separately from the power source (first alternating current power source 10A) connected to the sub-power source 20. Further, by using the power supply from sub power source 20, the circuit that detects abnormalities of the second alternating current power source 10B and protects the second main circuit 15B can be protected and recovered by itself. Furthermore, the instantaneous power failure detector circuit 41 is added to a power line of the first alternating current power source 10A, so that the power supply circuit 2A can protect the first main circuit 15A from instantaneous power failure or the low voltage while operating the sub-power source 20.

Note that, FIGS. 7 and 8 show examples in which the high voltage detection circuit 40 is connected to the second alternating current power source 10B, but a low voltage detection circuit may be connected to the second alternating current power source 10B. Of course, the voltage abnormality detection circuit 45, which detects both high and low voltages, may be connected to the second alternating current power source 10B. Note that, by only the presence or absence of a Zener diode or modifying operation of IC (difference in time constant), the high voltage detection and the low voltage detection can be changed.

Figure 11:
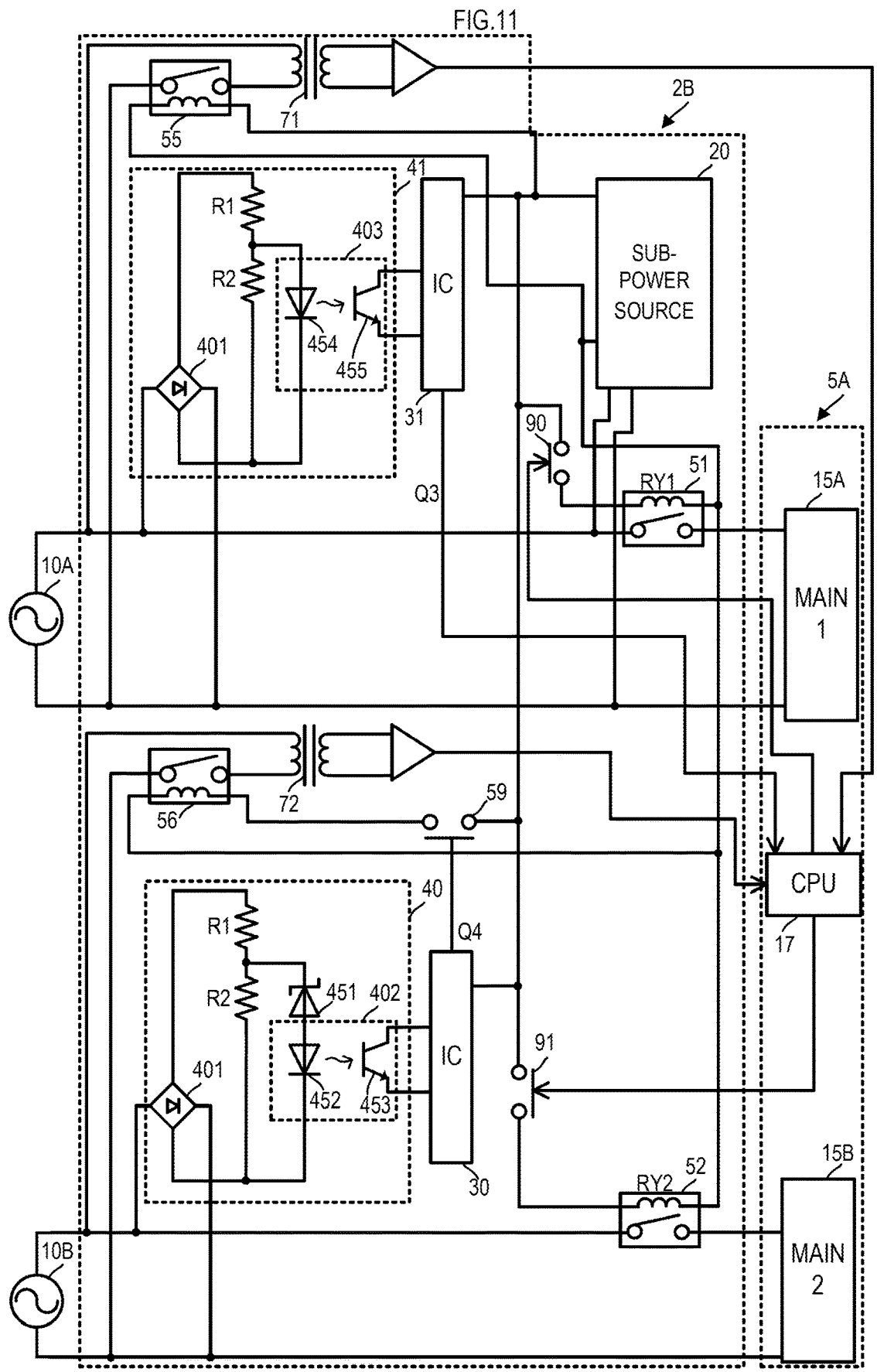
FIG. 11 is a circuit diagram showing a structure of a power supply circuit 2B in accordance with a fifth exemplary embodiment.

Note that, the protection target circuit is not limited to the main circuit, but may include a transformer 71 or a transformer 72 as shown in FIG. 11, for example.

FIG. 11 is a circuit diagram showing a structure of a power supply circuit 2B in accordance with a fifth exemplary embodiment. Note that, the same reference numerals are assigned to the same components as in power supply circuit 2A of FIG. 8, and the description thereof is omitted. By using software of the CPU 17, the power supply circuit 2B monitors the voltage of the first alternating current power source 10A and the second alternating current power source 10B through alternating current signals insulated by transformers 71 and 72, and protects the first main circuit 15A and the second main circuit 15B, individually. Further, the power supply circuit 2B uses hardware to protect the transformer 71 and the transformer 72 from the high voltage.

The power supply circuit 2B further includes the transformer 71, the transformer 72, a relay switch 55, a relay switch 56, a switch 59, and a switch 91. The transformer 71 is connected to a first alternating current power source 10A. The relay switch 55 is connected between the first alternating current power source 10A and the transformer 71. A sub-power source 20 drives the relay switch 55. When the sub-power source 20 operates, the relay switch 55 is turned on, so that the transformer 71 and the first alternating current power source 10A are connected to each other. When the sub-power source 20 is stopped, the relay switch 55 is turned off, so that the first alternating current power source 10A and the transformer 71 are disconnected from each other.

The relay switch 51 is connected between the first alternating current power source 10A and a first main circuit 15A. The switch 90 is connected between the sub-power source 20 and the relay switch 51. The relay switch 52 is connected between a second alternating current power source 10B and a second main circuit 15B. The switch 91 is connected between the sub-power source 20 and the relay switch 52. The CPU 17 turns on or turns off the switch 90 and the switch 91.

The transformer 72 is connected to the second alternating current power source 10B. The relay switch 56 is connected between the second alternating current power source 10B and the transformer 72. The sub-power source 20 drives the relay switch 56. The switch 59 is connected between the relay switch 56 and the sub-power source 20. The switch 59 is connected to an IC 30. When the sub-power source 20 operates and the switch 59 is turned on, the relay switch 56 is turned on, so that the second alternating current power source 10B and the transformer 72 are connected to each other. When the sub-power source 20 is stopped, the relay switch 56 is turned off, so that the second alternating current power source 10B and the transformer 72 are disconnected from each other. Further, when the switch 59 is turned off, the relay switch 56 is turned off, so that the second alternating current power source 10B and the transformer 72 are disconnected from each other.

Secondary sides of transformer 71 and transformer 72 are connected to the CPU 17. The CPU 17 uses the software to monitor power source states (alternating current signals insulated by the transformers 71 and 72) of the first alternating current power source 10A and the second alternating current power source 10B. Note that, operational amplifiers, each of which is connected between the transformer 71 and the CPU 17 or between the transformer 72 and the CPU 17, are illustrated in the figure, but not essential components.

When the power source state of the first alternating current power source 10A is abnormal (e.g., high voltage, instantaneous power failure, or low voltage), the CPU 17 turns off the switch 90, so that the relay switch 51 is turned off. Accordingly, the CPU 17 protects the first main circuit 15A from the high voltage, the instantaneous power failure, or the low voltage.

Further, when the power source state of the second alternating current power source 10B is abnormal (e.g., high voltage, instantaneous power failure, or low voltage), the CPU 17 turns off switch 91, so that the relay switch 52 is turned off. Accordingly, the CPU 17 protects the second main circuit 15B from the high voltage, the instantaneous power failure, or the low voltage.

Figure 12:
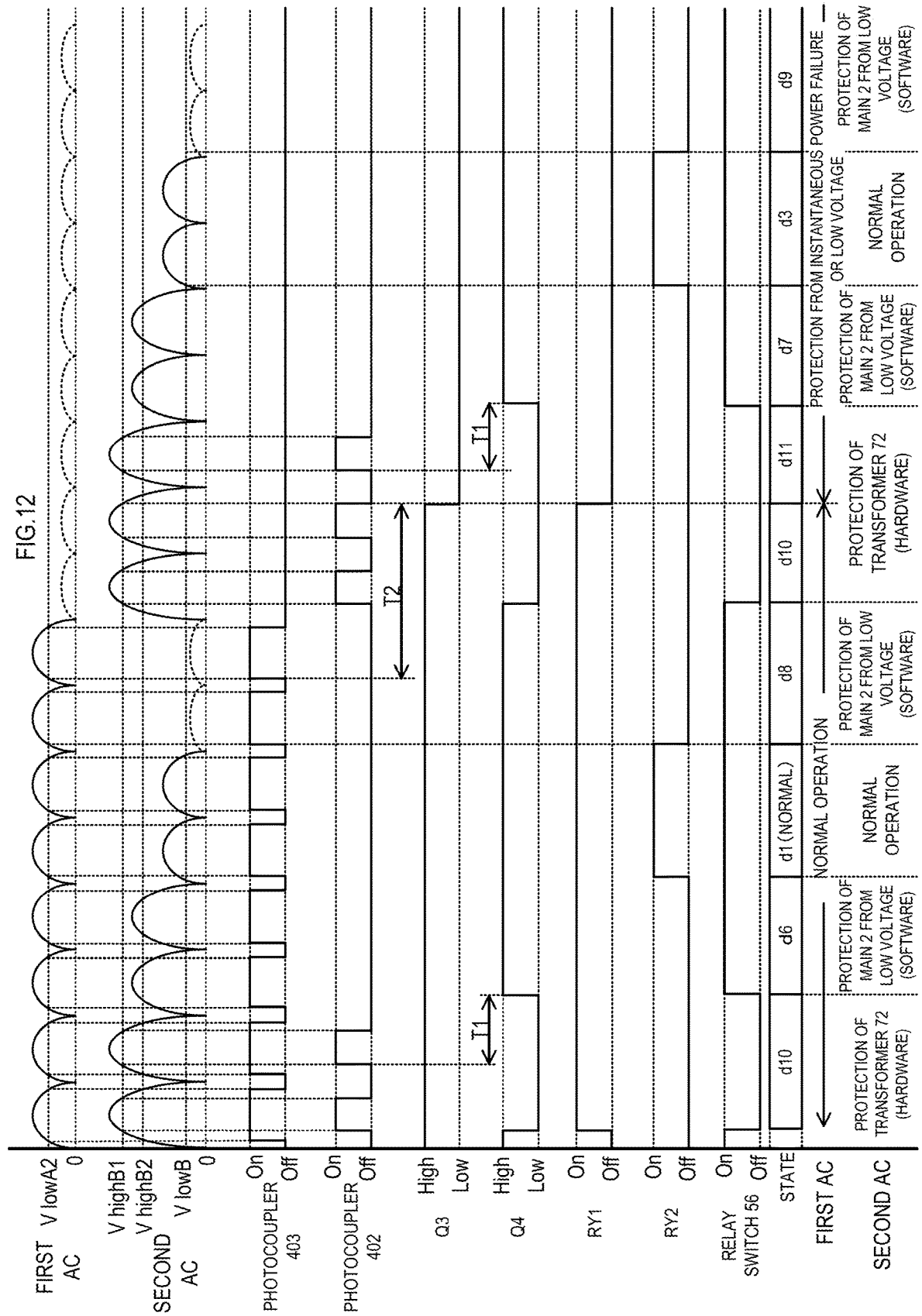
FIG. 12 is an explanatory view showing an operation of the power supply circuit 2B.

FIG. 12 is a view showing an operation of the power supply circuit 2B according to time series. As shown in FIG. 12, when the voltage of the first alternating current power source 10A exceeds predetermined voltage VlowA2, the output of the photocoupler 403 is changed into an on-state. Even if predetermined time T2 has elapsed, when the output of the photocoupler 403 remains in an off-state, the IC 31 changes an output Q3 into a low level. The CPU 17 monitors the output Q3 of the IC 31. When the output Q3 is changed into the low level, the CPU 17 turns off the switch 90. Therefore, the relay switch 55 is turned off (RY1=Off). In this case, although the sub-power source 20 is in operation and electric power remains supplied to the IC 31, power supply from the first alternating current power source 10A to the first main circuit 15A is intercepted.

The CPU 17 monitors voltage of the second alternating current power source 10B through the transformer 72. When the voltage of the second alternating current power source 10B exceeds predetermined voltage VhighB2, the CPU 17 turns off the switch 91, so that the relay switch 52 is turned off (RY2=Off). Accordingly, the CPU 17 protects the second main circuit 15B (MAIN2) from the high voltage. Further, when the voltage of the second alternating current power source 10B is decreased to less than or equal to predetermined voltage VlowB, the CPU 17 turns off the switch 91, so that the relay switch 52 is turned off (RY2=Off). Accordingly, the CPU 17 can protect the second main circuit 15B from instantaneous power failure or the low voltage.

On the other hand, when the voltage of the second alternating current power source 10B is increased to abnormally high voltage more than predetermined voltage VhighB1, the photocoupler 402 is turned on, so that an output Q4 of the IC 30 is changed into a low level. In this case, the switch 59 is turned off, so that the relay switch 56 is turned off. Accordingly, the power supply from the second alternating current power source 10B to the transformer 72 is intercepted. When the relay switch 56 is turned off, the CPU 17 is not allowed to monitor the state of the second alternating current power source 10B through the transformer 72 by using the software. Even if the relay switch 56 is turned off, however, electric power remains supplied to the IC 30 from the sub-power source 20. Accordingly, when the state of the second alternating current power source 10B is changed to be normal, the output Q4 of the IC 30 is changed into a high level, so that the switch 59 is turned on. Thus, the relay switch 56 is turned on, and the CPU 17 restarts monitoring the second alternating current power source 10B by using the software. In this way, by using the power supply from the sub-power source 20, the high voltage detection circuit 40 and the IC 30 can be recovered by itself, while using the hardware to protect the transformer 72 from the high voltage.

Figure 13:
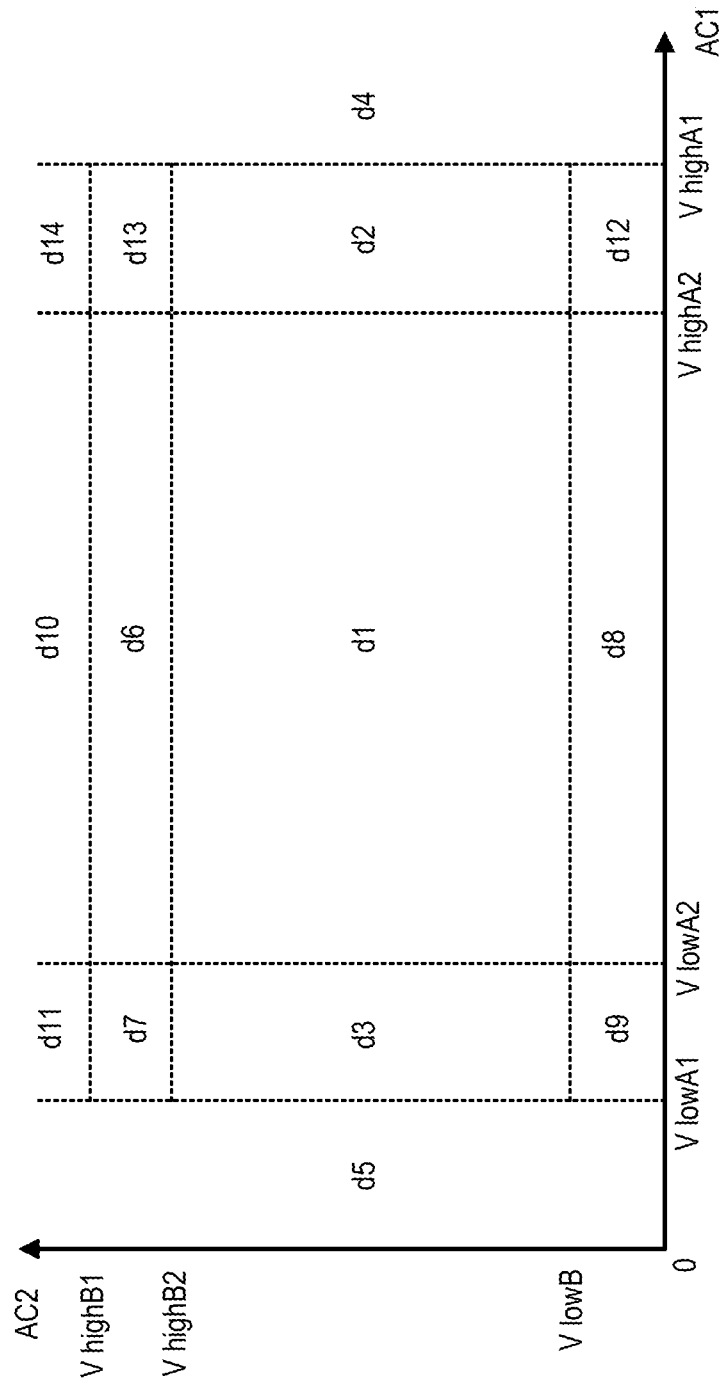
FIG. 13 is a schematic view showing a range of voltage.

FIG. 13 is a schematic view showing a range of voltage, and FIGS. 14 and 15 are views showing an operation state. When the first alternating current power source 10A is in states d3, d7, d9, and d11 that is subjected to instantaneous power failure or abnormally low voltage (less than or equal to VlowA), the IC 31 changes the output Q3 into the low level. The CPU 17 monitors the output Q3 of the IC 31. When the output Q3 is changed into the low level, the CPU 17 turns off the switch 90, so that the relay switch 51 is turned off (RY1=Off). Accordingly, the CPU 17 operates software to protect the first main circuit 15A (MAIN1) from instantaneous power failure or the abnormally low voltage. In the state d3, the second alternating current power source 10B has the normal voltage, but if more safety is required, the CPU 17 will turn off switch 91 and intercept the power supply to the second main circuit 15B. The CPU 17 may, however, operate the second main circuit 15B without turning off the switch 91.

In the case where the first alternating current power source 10A is subjected to instantaneous power failure or abnormally low voltage (less than or equal to VlowA2), if the voltage of the second alternating current power source 10B exceeds the predetermined voltage Vhigh B2, i.e., in the state d7, the CPU 17 will turn off the switch 91, so that the relay switch 52 is turned off (RY2=Off). In the state d7, the CPU 17 operates the software to protect the first main circuit 15A (MAIN1) from the instantaneous power failure or the low voltage, and protect the second main circuit 15B (MAIN2) from the high voltage.

In the case where the first alternating current power source 10A is subjected to instantaneous power failure or the abnormally low voltage (less than or equal to VlowA2), if the voltage of the second alternating current power source 10B exceeds VhighB1 that is higher than VhighB2, i.e., in the state d11, the output Q4 of the IC 30 will be changed into the low level. Accordingly, the switch 59 is turned off, so that the relay switch 56 is also turned off. In the state d11, the hardware is used to protect the transformer 72 whose breakdown voltage is higher than that of the second main circuit 15B.

Further, in the case where the first alternating current power source 10A is subjected to instantaneous power failure or abnormally low voltage (less than or equal to VlowA2), if the voltage of the second alternating current power source 10B is decreased to less than or equal to predetermined voltage VlowB, i.e., in the state d9, the CPU 17 will turn off the switch 91, so that the relay switch 52 is turned off (RY2=Off). In the state d9, the CPU 17 operates the software to protect the first main circuit 15A from the instantaneous power failure or the low voltage and protect the second main circuit 15B (MAIN2) from the instantaneous power failure or the low voltage.

Further, even if the first alternating current power source 10A is in a normal state, in a state d8, i.e., when the voltage of the second alternating current power source 10B is decreased to less than or equal to the predetermined voltage VlowB, the CPU 17 turns off the switch 91, so that the relay switch 52 is turned off (RY2=Off). In the state d8, although the first alternating current power source 10A is in the normal operation, the CPU 17 operates the software to protect the second main circuit 15B (MAIN2) from the instantaneous power failure or the low voltage. Note that, in the state d8, if more safety is required, the CPU 17 will turn off switch 90 and intercept the power supply to the first main circuit 15A. The CPU 17 may, however, operate the first main circuit 15A without turning off switch 90.

Even if the first alternating current power source 10A is in the normal state, in the state d6, i.e., when the voltage of the second alternating current power source 10B exceeds the predetermined voltage VhighB2, the CPU 17 turns off the switch 91, so that the relay switch 52 is turned off (RY2=Off). In the state d6, although the first alternating current power source 10A is in the normal operation, the CPU 17 operates the software to protect the second main circuit 15B (MAIN2) from the high voltage. Note that, in the state d6, if more safety is required, the CPU 17 will turn off the switch 90 and intercept the power supply to the first main circuit 15A. The CPU 17 may, however, operate the first main circuit 15A without turning off the switch 90.

Even if the first alternating current power source 10A is in the normal state, in a state d10, i.e., when the voltage of the second alternating current power source 10B exceeds the predetermined voltage VhighB1, the output Q4 of the IC 30 is changed into the low level. Accordingly, the switch 59 is turned off, so that the relay switch 56 is also turned off. In the state d11, although the first alternating current power source 10A is in the normal operation, the hardware is used to protect the transformer 72 whose breakdown voltage is higher than that of the second main circuit 15B. Note that, in the state d10, if more safety is required, the CPU 17 will turn off the switch 90 and intercept the power supply to the first main circuit 15A. The CPU 17 may, however, operate the first main circuit 15A without turning off the switch 90.

Further, even if the second alternating current power source 10B is in a normal state, in the state d2, i.e., when the voltage of the first alternating current power source 10A exceeds predetermined voltage VhighA2, the CPU 17 turns off the switch 90, so that the relay switch 51 is turned off. In the state d2, although the second alternating current power source 10B is in the normal operation, the CPU 17 operates the software to protect the first main circuit 15A (MAIN1) from the high voltage.

In a state d12, i.e., when the voltage of the first alternating current power source 10A exceeds the predetermined voltage VhighA2 and the voltage of the second alternating current power source 10B is decreased to less than or equal to the predetermined voltage VlowB, the CPU 17 turns off the switch 90, so that the relay switch 51 is turned off. Furthermore, the CPU 17 turns off the switch 91, so that the relay switch 52 is turned off. In the state d12, the CPU 17 operates the software to protect the first main circuit 15A (MAIN1) from the high voltage and protect the second main circuit 15B (MAIN2) from the instantaneous power failure or the low voltage.

In a state d13, i.e., when the voltage of the first alternating current power source 10A exceeds the predetermined voltage VhighA2 and the voltage of the second alternating current power source 10B exceeds the predetermined voltage VhighB2, the CPU 17 turns off the switch 90, so that the relay switch 51 is turned off. Furthermore, the CPU 17 turns off the switch 91, so that the relay switch 52 is turned off. In the state d13, the CPU 17 operates the software to protect the first main circuit 15A (MAIN1) from the high voltage and protect the second main circuit 15B (MAIN2) from the high voltage.

In a state d14, i.e., when the voltage of the first alternating current power source 10A exceeds the predetermined voltage VhighA2 and the voltage of the second alternating current power source 10B exceeds the predetermined voltage VhighB1, the CPU 17 turns off the switch 90, so that the relay switch 51 is turned off. Further, the output Q4 of the IC 30 is changed into the low level, so that the switch 59 is turned off and thereby the relay switch 56 is also turned off. In the state d14, the CPU 17 operates the software to protect the first main circuit 15A (MAIN1) from the high voltage, and the hardware is used to protect the transformer 72.

In the state d4, i.e., when the voltage of the first alternating current power source 10A exceeds predetermined voltage VhighA1, or in the state d5, i.e., when the voltage of the first alternating current power source 10A is decreased to less than or equal to predetermined voltage VlowA1, the sub-power source 20 is stopped. Accordingly, the relay switch 51, the relay switch 52, the relay switch 55, and the relay switch 56 all are turned off, so that the circuits in the subsequent stage of the first alternating current power source 10A and the second alternating current power source 10B, i.e., the first main circuit 15A, the second main circuit 15B, the transformer 71, and the transformer 72 all are protected.

In all of the states d1, d2, d3, d6, d7, d8, d9, d10, d11, d12, d13, and d14, the sub-power source 20 is in operation. Therefore, the power supply circuit 2B protects the first main circuit 15A and the second main circuit 15B, both of which have a low breakdown voltage, while operating one sub-power source 20. Further, the power supply circuit 2B can also use the hardware to protect the transformer 72, while operating one sub-power source 20. In this way, depending on breakdown voltage of each circuit, the power supply circuit 2B can supply or intercept electric power appropriately, while operating the sub-power source 20.

In this way, in a circuit required for connecting with a plurality of power sources, by using only one sub-power source 20, the power supply circuit 2B also protects not only a power source (first alternating current power source 10A) of a power line to which the sub-power source 20 is connected, but a power source (second alternating current power source 10B) of another power line provided separately from the power source (first alternating current power source 10A) connected to the sub-power source 20. Further, by using the power supply from the sub-power source 20, the circuit (high voltage detection circuit 40 and IC 30) that detects abnormalities of the second alternating current power source 10B and uses the hardware to protect the transformer 72 can be protected and recovered by itself.

Note that, the above-mentioned example exemplarily shows that the power supply is intercepted by a relay switch as a protection function unit in which voltage applied to a protection target circuit is restricted to a predetermined range. For instance, however, a resistor may also be inserted to restrict the voltage to the predetermined range (less than predetermined voltage).

Further, the above description shows the configuration in which a photocoupler is used as the power source abnormality detection circuit, but not limited to this. An insulating circuit such as a transformer or a switch may be used to achieve the power source abnormality detection circuit.

Lastly, the foregoing preferred embodiments are illustrative in all points and should not be construed to limit the present invention. The scope of the present invention is defined not by the foregoing preferred embodiment but by the following claims. Further, the scope of the present invention is intended to include all modifications within the scopes of the claims and within the meanings and scopes of equivalents.

What is claimed is:

1. A power supply circuit comprising:
    an internal power source that receives electric power from an external power source;
    an abnormality detection circuit that detects abnormalities of the external power source;
    a protection target circuit that receives the electric power from the external power source; and
    a protection function unit that restricts electric power supplied to the protection target circuit to a predetermined range, upon the abnormality detection circuit detecting the abnormalities,
    wherein the external power source includes a first external power source and a second external power source,
    wherein the internal power source receives electric power from at least one of the first or second external power source, and
    wherein the abnormality detection circuit detects abnormalities of the second external power source.

2. The power supply circuit according to claim 1, wherein:
    the internal power source includes a comparator, and
    the comparator compares a reference voltage and a detection target voltage corresponding to the first external power source to detect abnormalities of the first external power source.

3. The power supply circuit according to claim 1, wherein the abnormalities of the second external power source include a state of high voltage greater than a first predetermined voltage and a state of low voltage less than or equal to a second predetermined voltage.

4. The power supply circuit according to claim 1, wherein the protection function unit relieves restriction of the electric power supplied to the protection target circuit after a predetermined time elapses in a state where the abnormality detection circuit detects no abnormalities.

5. The power supply circuit according to claim 1, wherein the protection target circuit includes a circuit that processes a sound signal.

6. The power supply circuit according to claim 1, wherein the internal power source receives power from the first external power source.

7. A sound equipment comprising:
    a sound processing circuit; and
    a power supply circuit that supplies electric power to the sound processing circuit, and comprising:

an internal power source that receives electric power from an external power source;

an abnormality detection circuit that detects abnormalities of the external power source;

a protection target circuit that receives the electric power from the external power source; and a protection function unit that restricts electric power supplied to the sound processing circuit to a predetermined range, upon the abnormality detection circuit detecting the abnormalities, wherein the external power source includes a first external power source and a second external power source, wherein the internal power source receives electric power from at least one of the first or second external power source, and wherein the abnormality detection circuit detects abnormalities of the second external power source.

8. The sound equipment according to claim 7, wherein the internal power source receives electric power from the first external power source.

* * * * *